(12) United States Patent
Bai

(10) Patent No.: US 10,791,598 B1
(45) Date of Patent: Sep. 29, 2020

(54) ELECTRONIC COLOR TEMPERATURE ADJUSTMENT CIRCUIT

(71) Applicant: NINGBO JINGHUI OPTO-ELECTRONIC CO., LTD., Zhejiang Province (CN)

(72) Inventor: Guohui Bai, Zhejiang Province (CN)

(73) Assignee: NINGBO JINGHUI OPTO-ELECTRONIC CO., LTD., Zhejiang Province (CN)

(*) Notice: Subject to any disclaimer, the term of this patent is extended or adjusted under 35 U.S.C. 154(b) by 0 days.

(21) Appl. No.: 16/682,634

(22) Filed: Nov. 13, 2019

(30) Foreign Application Priority Data

Jul. 31, 2019 (CN) .................... 2019 2 1223595 U

(51) Int. Cl.
*H05B 45/20* (2020.01)
*H03K 7/08* (2006.01)

(52) U.S. Cl.
CPC .............. *H05B 45/20* (2020.01); *H03K 7/08* (2013.01)

(58) Field of Classification Search
None
See application file for complete search history.

(56) References Cited

U.S. PATENT DOCUMENTS

| | | | | |
|---|---|---|---|---|
| 2007/0291198 A1* | 12/2007 | Shen | .................... | G09G 3/3413 349/69 |
| 2011/0298834 A1* | 12/2011 | Shin | .................... | G09G 3/3406 345/690 |
| 2012/0019164 A1* | 1/2012 | Gambeski | .............. | B64D 47/02 315/294 |
| 2012/0242247 A1* | 9/2012 | Hartmann | .............. | H05B 45/20 315/294 |
| 2015/0305122 A1* | 10/2015 | Saes | ........................ | H05B 45/50 315/129 |
| 2019/0191512 A1* | 6/2019 | Zeng | ......................... | F21S 4/22 |

* cited by examiner

*Primary Examiner* — Crystal L Hammond
(74) *Attorney, Agent, or Firm* — Charles C. Achkar; Ostrolenk Faber LLP.

(57) ABSTRACT

The present utility model provides an electronic color temperature adjustment circuit, which comprises a color temperature control module, a color temperature adjustment module and at least two lines of light-emitting diodes (LEDs) with different color temperatures, wherein said color temperature adjustment module is respectively connected with said color temperature control module and said LEDs, said color temperature control module is used to receive adjustment and control information of the user and output pulse width modulation (PWM) signals with different duty ratios to said color temperature adjustment module according to said adjustment and control information, and said color temperature adjustment module is used to change the color temperatures of the LEDs according to the PWM signals sent by said color temperature control module. The electronic color temperature adjustment circuit provided by the present utility model can realize different requirements for two or more lines of color temperatures and can control on-off of the LEDs at the time of color temperature adjustment. The present utility model effectively solves the problem with dazzling and has the advantages such as ease-to-operate and a long service life.

6 Claims, 4 Drawing Sheets

ELECTRONIC COLOR TEMPERATURE ADJUSTMENT CIRCUIT

CROSS REFERENCE TO RELATED APPLICATIONS

The present application claims priority to China Application No. 201921223595.1 filed on Jul. 31, 2019, the subject matter of which is incorporated herein by reference in its entirety.

TECHNICAL FIELD

The present utility model relates to the field of lights, and in particular relates to an electronic color temperature adjustment circuit.

BACKGROUND ART

LEDs are apparatuses which can transmit light and allocate and change the distribution of the light of an LED light source. Except the LED light source, LEDs comprise all the parts required to fix and protect the LED light source and the line accessories required to connect the power source. In view of the technical characteristics of LEDs such as high efficiency, energy conservation, safety, long service life, compactness and clear light rays, LEDs are becoming staple products in the new generation lighting market and vigorously promote the rapid development of the energy-saving and environmental-friendly industry. With the development of light technologies, the simple lighting-up of LEDs already cannot satisfy people's aesthetic needs. To adapt to different scenarios and different application requirements, LEDs are gradually so developed from a single light color that they can give out light with a plurality of different color temperatures by adjusting the color temperatures.

A mechanically sliding switch is usually adopted for traditional color temperature adjustable LEDs to control three lines of color temperatures. In addition, when color temperatures are adjusted, LEDs are still on and the light emitted from the LEDs are dazzling and uncomfortable. Furthermore, a mechanical toggle switch is usually adopted for traditional color temperature adjustable LEDs to adjust the resistance of the drain electrode of the MOSFET and thus adjust the operating current of the LEDs to realize light adjustment. This light adjustment mode is inconvenient and cannot realize automatic switchover between color temperatures. Moreover, the traditional mechanical toggle switch is apt to oxidize, and the service life is short.

SUMMARY OF THE UTILITY MODEL

(1) Technical Problem to be Solved

The technical problem to be solved by the present utility model is to provide an electronic color temperature adjustment circuit which is convenient to adjust, can turn off LEDs during an adjustment, can realize an automatic switchover between color temperatures and has a long service life.

(2) Technical Solution

To solve the above-mentioned technical problem, the present utility model provides an electronic color temperature adjustment circuit, which comprises a color temperature control module, a color temperature adjustment module and at least two lines of LEDs with different color temperatures, wherein said color temperature adjustment module is respectively connected with said color temperature control module and said LEDs, said color temperature control module is used to receive adjustment and control information of the user and output PWM signals with different duty ratios to said color temperature adjustment module according to said adjustment and control information, and said color temperature adjustment module is used to change the color temperatures of the LEDs according to the PWM signals sent by said color temperature control module.

Further, said color temperature adjustment module comprises a plurality of MOSFETs, the drain electrodes of said MOSFETs are respectively connected with the negative electrodes of the corresponding said LEDs, the positive electrodes of said LEDs and the source electrodes of said MOSFETs are respectively connected to the corresponding power supply end, and the gate electrodes of said MOSFETs are respectively connected with the output end of the corresponding said color temperature control module.

Further, said color temperature control module comprises a control unit U2, said control unit U2 is provided with two or more PWM output ends, and the PWM output ends of said control unit U2 are respectively connected with the gate electrodes of the corresponding MOSFETs. PWM signals with different duty ratios from said color temperature control module can change the breakover depth of said MOSFETs, and then the currents passing said LEDs are changed to change the color temperatures of said LEDs.

Further, said electronic color temperature adjustment circuit further comprises a switch K2, and said switch K2 is connected between the output ends of said control unit U2 and the power supply end and is used to send adjustment and control information to said color temperature control module.

Further, said electronic color temperature adjustment circuit further comprises a switch K1 and another switch K2, said switch K1 and said switch K2 are respectively connected to the corresponding input ends of said control unit U2, said switch K1 is used to send signals to said color temperature control module to control on-off of said LEDs, and said switch K2 is used to send adjustment and control information to said color temperature control module.

Further, said electronic color temperature adjustment circuit further comprises a plurality of indicators D5, and said indicators D5 are respectively connected with the output ends of the corresponding said control unit U2 and are used to display the color temperatures which are currently adjusted to.

Further, said adjustment and control information comprises first adjustment and control information and second adjustment and control information; if said switch K2 is pressed down for a short time, first adjustment and control information is sent to said color temperature control module and the PWM output ends of said control unit U2 output different PWM signals to change the color temperatures of said LEDs; if said switch K2 is pressed down for a long time, second adjustment and control information is sent to said color temperature control module, the PWM output ends of said control unit U2 are automatically switched over to output different PWM signals, and then the color temperatures of said LEDs are automatically switched over.

(3) Advantageous Effects

The electronic color temperature adjustment circuit provided by the present utility model is provided with a plurality of LED modules with different color temperatures.

One digital switch provides high and low levels to transmit signals to the control unit, the control unit outputs PWM signals to control the breakover depth of MOSFETs to adjust the operating current of the LEDs and meet the color temperature adjustment requirements, and different requirements for two or more lines of color temperatures can be satisfied. Moreover, another digital switch provides high and low levels to transmit signals to the control unit, the control unit outputs PWM signals to control the breakover of the MOSFETs to control on-off of the LEDs and adjust the color temperatures. In this way, the problem with dazzling encountered by the user at the time of operations is effectively solved. In addition, automatic color temperature switchover can be realized. The present utility model has the advantages such as ease-to-operate, a wide scope of application and a long service life.

DETAILED DESCRIPTION OF THE UTILITY MODEL

Embodiment 1

Figure 1:
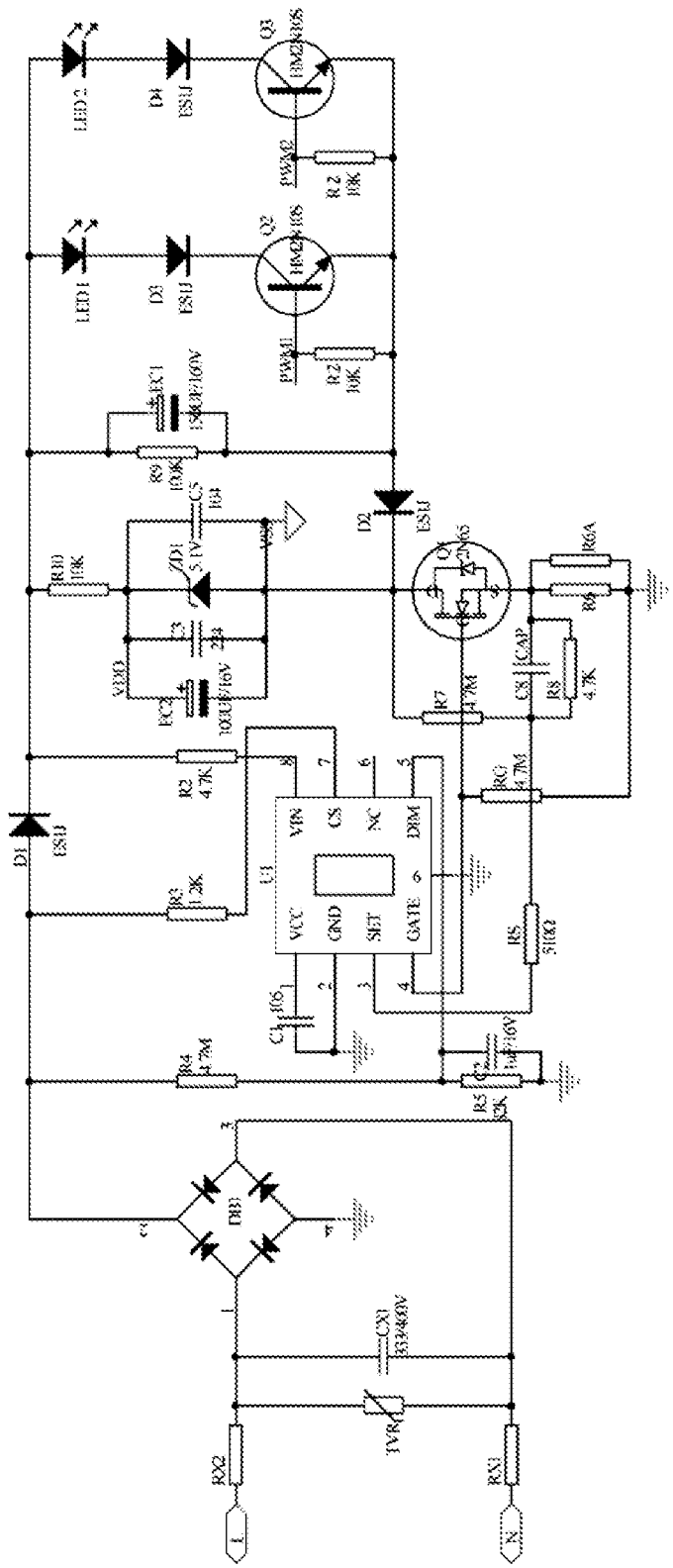
FIG. 1 is a schematic diagram of an electronic color temperature adjustment circuit of the present utility model.
Figure 2:
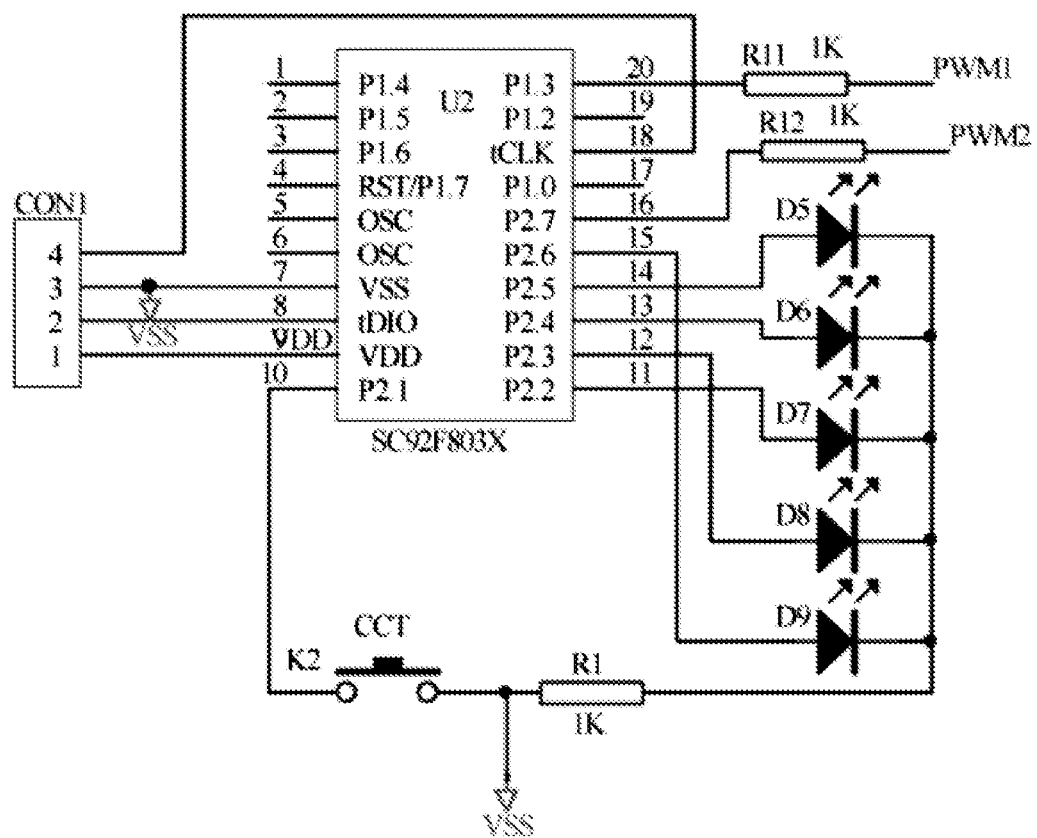
FIG. 2 is a schematic diagram of the circuit of the color temperature control module in embodiment 1 of an electronic color temperature adjustment circuit of the present utility model.

As shown in FIGS. 1 and 2, an electronic color temperature adjustment circuit provided by the present utility model comprises a color temperature control module, a color temperature adjustment module, two lines of LEDs LED1 and LED2 with different color temperatures, a power fetching module and LED power supply module, wherein the power fetching module is connected with the LED power supply module, the color temperature adjustment module is respectively connected with the color temperature control module and the LEDs, the color temperature control module is used to receive adjustment and control information of the user and output PWM signals with different duty ratios to the color temperature adjustment module according to the adjustment and control information, and the color temperature adjustment module is used to change the color temperatures of the LEDs according to the PWM signals sent by said color temperature control module. The color temperature module comprises MOSFET Q2, MOSFET Q3, freewheeling diode D3 and freewheeling diode D4, the positive electrodes of LED1 and LED2 are connected in parallel with the output end of the LED power supply module, the freewheeling diode D3 is connected in series with LED1, and the negative electrode of the freewheeling diode D3 is connected with the drain electrode of the MOSFET Q2. The freewheeling diode D4 is connected in series with LED2 and the negative electrode of the freewheeling diode D4 is connected with the drain electrode of the MOSFET Q3. A resistor RZ is respectively connected between the gate electrode and the source electrode of MOSFETs Q2 and Q3, and the source electrodes of MOSFETs Q2 and Q3 are both connected with the LED power supply module via a diode D2 to form a loop. The color temperature control module comprises a control unit U2, the control unit U2 is provided with two PWM output ends, the PWM1 output end of the control unit U2 is connected with the gate electrode of the MOSFET Q2 via a resistor R11, and the PWM2 output end of the control unit U2 is connected with the gate electrode of MOSFET Q3 via a resistor R12. The switch K2 is connected between the input end of the control unit U2 and the power supply end VSS. Five indicators D5 are further provided in the present embodiment, the indicators D5 are respectively connected with the output ends of the corresponding control unit U2, and the indicators D5 can display the color temperatures which are currently adjusted to. When the switch K2 is pressed, the control unit U2 receives adjustment and control information, changes the duty ratios of PWM signals output from the PWM1 output end and the PWM2 output end of the control unit U2, and changes the breakover depths of MOSFETs Q2 and Q3 so that the operating currents of LED1 and LED2 are changed and LED1 and LED2 give out light with different color temperatures.

Wherein, the control unit U2 can make different responses according to different pressed states of the switch K2; if the switch K2 is pressed down for a short time, the control unit U2 receives first adjustment and control information, the PWM1 output end and the PWM2 output end of the control unit U2 output different PWM signals to change the color temperatures of LED1 and LED2; if the switch K2 is pressed down for a long time, the control unit U2 receives second adjustment and control information, the two PWM output ends of the control unit U2 are automatically switched over to output different PWM signals, and then the color temperatures of the LEDs are automatically switched over. The switches K2 and K3 are both mechanical key switches, and the control unit U2 is an SC92F8003 chip.

The power fetching module shown in FIG. 1 is an AC power fetching module and the power fetching module comprises a live (L) end, a wire wound resistor RX2, a rectifier bridge DB1, a wire wound resistor RX1 and a neutral (N) end which are connected in series in turn to form a loop. A varistor TVR and a capacitor CX1 are connected in parallel with the input end of the rectifier bridge DB1 and the output end of the rectifier bridge DB1 is connected to the LED power supply module. The power fetching module can convert an AC power supply into a DC power supply to supply power to LEDs. The LED power supply module comprises a constant-current dimming control chip U1 and peripheral circuits, wherein the constant-current dimming control chip U1 is used for TRIode AC semiconductor switch (TRIAC) dimming and is used to provide a constant current for the color temperature adjustment module. The peripheral circuits include a current control circuit, a power output protection circuit, a dimming control circuit and a high-voltage feedback circuit; the current control circuit comprises a resistor R3 and the resistor R3 is connected to the CS end of the constant-current dimming control chip U1 and the output end of the rectifier bridge DB1; the dimming control circuit comprises a resistor R4 and another resistor R5, the resistors R4 and R5 are connected in series between the output end of the rectifier bridge DB1 and the grounding end, the common end of the resistors R4 and R5 is connected with the DIM end of the constant-current dimming control chip U1, and the resistances of the resistors R4 and R5 are 4.7 mega-ohm and 83 kilo-ohm, respectively; the power output protection circuit comprises a resistor R2, the output end of the rectifier bridge DB1 is also connected with a freewheeling diode D1, and the resistor D2 is connected to the negative electrode end of the freewheeling diode D1 and the VIN end of the constant-current dimming control chip U1; the high-voltage feedback circuit comprises a MOSFET Q1 and resistors RS, R7 and R8, the gate electrode of the MOSFET Q1 is connected with the GATA end of the constant-current dimming control chip U1, the drain electrode is connected to the negative electrode of the diode D2, resistors RS and R8 are connected in series between the source electrode and the SET end of the constant-current dimming control chip U1, resistor R7 is connected between the common end of resistors RS and R8 and the drain electrode of the MOSFET Q1, and the resistances of resistors RS, R7, and R8 are 510 ohm, 4.7 mega-ohm and 4.7 kilo-ohm, respectively. Resistor R6 is connected between the source electrode of the MOSFET Q1 and the grounding end, and resistor R6 is a constant-current control resistor.

Wherein, the constant-current dimming control chip U1 is an ORG6611 chip, and MOSFETs Q1, Q2 and Q3 are all N type MOSFETs.

Embodiment 2

Figure 3:
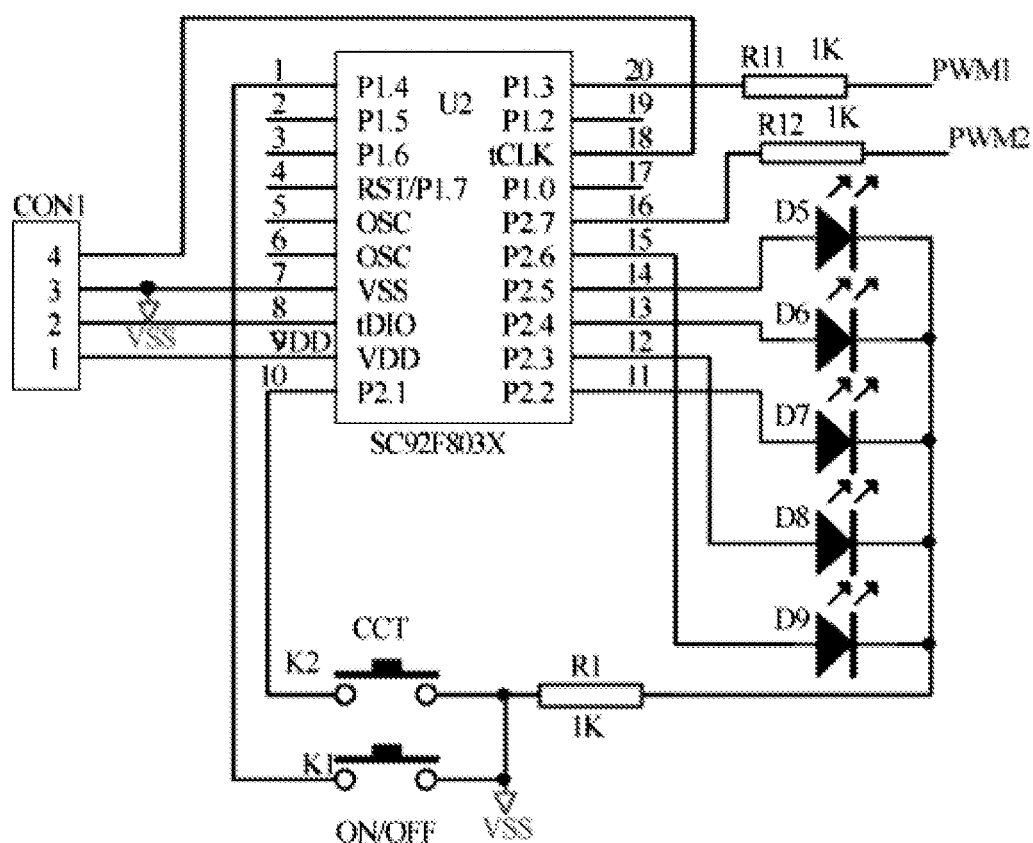
FIG. 3 is a schematic diagram of the circuit of the color temperature control module in embodiment 2 of an electronic color temperature adjustment circuit of the present utility model.
Figure 4:
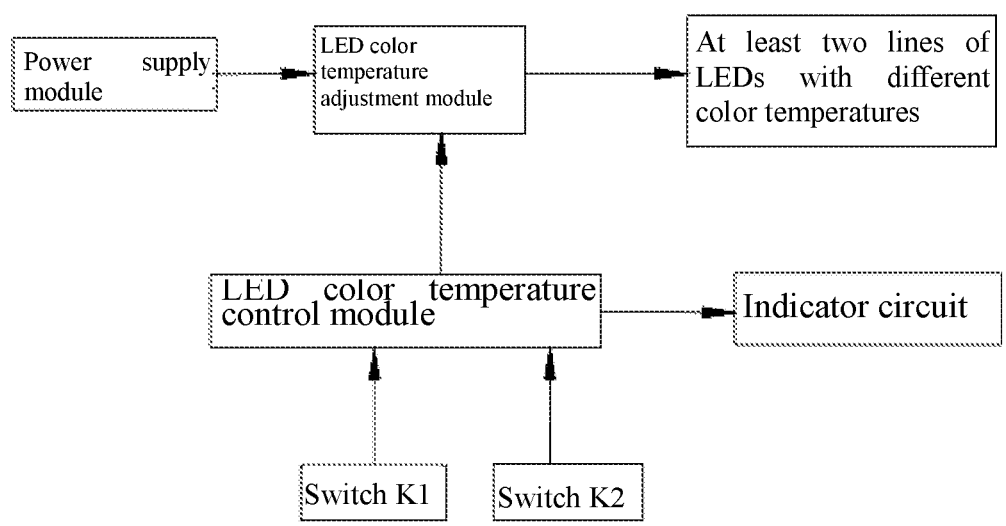
FIG. 4 is a schematic block diagram of embodiment 2 of an electronic color temperature adjustment circuit of the present utility model.

As shown in FIGS. 3 and 4, the only difference of embodiment 2 from embodiment 1 is that a switch K1 is added in embodiment 2 and the switch K1 is connected between the P1.4 port of the single chip and the power supply end VSS. If the switch K1 is pressed, the P1.4 port of the control unit U2 detects a high level so that no signal is output from the PWM1 output end and the PWM2 output end, the MOSFETs Q2 and Q3 are both off, and LED1 and LED2 are both off. If the switch is pressed again, LED1 and LED2 are both on.

Embodiment 2 is further described. The switches K1 and K2 are both mechanical key switches and are both installed on the power board. After power-on, color temperatures are adjusted by directly pressing the switch K2, or LEDs are turned off by first pressing the switch K1 and then color temperatures are adjusted by pressing the switch K2. To avoid dazzling during a color temperature adjustment, LEDs are usually first turned off. The switch K1 is pressed down, the single chip outputs PWM signals so that the MOSFET Q2 and Q3 are both off, and LED1 and LED2 are off. Then the switch K2 is pressed down, the indicators D5 are on at the same time and the color temperatures which are adjusted to can be learned from the indicators D5. After that, the switch K1 is pressed down, LED1 and LED2 are on and the color temperature adjustment is completed. Wherein, the indicators D5 will automatically be off if no operation is performed in 3 seconds.

The electronic color temperature adjustment circuit provided by the present utility model is provided with a plurality of LED modules with different color temperatures. One digital switch provides high and low levels to transmit signals to the single chip, the single chip outputs PWM signals to control the breakover depth of MOSFETs to adjust the operating current of the LEDs and meet the color temperature adjustment requirements, and different requirements for two or more lines of color temperatures can be satisfied. Moreover, another digital switch provides high and low levels to transmit signals to the single chip, the single chip outputs PWM signals to control the breakover of the MOSFETs to control on-off of the LEDs and adjust the color temperatures. In this way, the problem with dazzling encountered by the user at the time of operations is effectively solved. In addition, automatic color temperature switchover can be realized. The present utility model has the advantages such as ease-to-operate, a wide scope of application and a long service life.

Only preferred embodiments of the present utility model are described above. It should be noted that those skilled in the art can make improvements and modifications without departing from the technical principle of the present utility model and these improvements and modifications should also fall within the scope of protection of the present utility model.

What is claimed is:

1. An electronic color temperature adjustment circuit, comprising a color temperature control module, a color temperature adjustment module and at least two lines of LEDs with different color temperatures, wherein said color temperature adjustment module is respectively connected with said color temperature control module and said LEDs, said color temperature control module is used to receive adjustment and control information of the user and output PWM signals with different duty ratios to said color temperature adjustment module according to said adjustment and control information, and said color temperature adjustment module is used to change the color temperatures of the LEDs according to the PWM signals sent by said color temperature control module;

wherein said color temperature adjustment module comprises a plurality of metal-oxide-semiconductor field effect transistors (MOSFETs), the drain electrodes of said MOSFETs are respectively connected with the negative electrodes of the corresponding said LEDs, the positive electrodes of said LEDs and the source electrodes of said MOSFETs are respectively connected to the corresponding power supply end, and the gate electrodes of said MOSFETs are respectively connected with the output end of the corresponding said color temperature control module;

wherein said color temperature control module comprises a control unit U2, said control unit U2 is provided with two or more PWM output ends, and the PWM output ends of said control unit U2 are respectively connected with the gate electrodes of the corresponding MOSFETs, wherein said electronic color temperature adjustment circuit further comprises a switch K2, and said switch K2 is connected between the output ends of said control unit U2 and the power supply end and is used to send adjustment and control information to said color temperature control module.

2. The electronic color temperature adjustment circuit as claimed in claim 1, wherein said electronic color temperature adjustment circuit further comprises a plurality of indicators D5, and said indicators D5 are respectively connected with the output ends of the corresponding said control unit U2 and are used to display the color temperatures which are currently adjusted to.

3. The electronic color temperature adjustment circuit as claimed in claim 1, wherein said adjustment and control information comprises first adjustment and control information and second adjustment and control information;

if said switch K2 is pressed down for a short time, first adjustment and control information is sent to said color temperature control module and the PWM output ends of said control unit U2 output different PWM signals to change the color temperatures of said LEDs;

if said switch K2 is pressed down for a long time, second adjustment and control information is sent to said color temperature control module, the PWM output ends of said control unit U2 are automatically switched over to output different PWM signals, and then the color temperatures of said LEDs are automatically switched over.

4. An electronic color temperature adjustment circuit, comprising a color temperature control module, a color temperature adjustment module and at least two lines of LEDs with different color temperatures, wherein said color temperature adjustment module is respectively connected with said color temperature control module and said LEDs, said color temperature control module is used to receive adjustment and control information of the user and output PWM signals with different duty ratios to said color temperature adjustment module according to said adjustment and control information, and said color temperature adjustment module is used to change the color temperatures of the LEDs according to the PWM signals sent by said color temperature control module;

wherein said color temperature adjustment module comprises a plurality of metal-oxide-semiconductor field effect transistors (MOSFETs), the drain electrodes of said MOSFETs are respectively connected with the negative electrodes of the corresponding said LEDs, the positive electrodes of said LEDs and the source electrodes of said MOSFETs are respectively connected to the corresponding power supply end, and the gate electrodes of said MOSFETs are respectively connected with the output end of the corresponding said color temperature control module;

wherein said color temperature control module comprises a control unit U2, said control unit U2 is provided with two or more PWM output ends, and the PWM output ends of said control unit U2 are respectively connected with the gate electrodes of the corresponding MOSFETs, wherein said electronic color temperature adjustment circuit further comprises a switch K1 and another switch K2, said switch K1 and said switch K2 are respectively connected to the corresponding input ends of said control unit U2, said switch K1 is used to send signals to said color temperature control module to control on-off of said LEDs, and said switch K2 is used to send adjustment and control information to said color temperature control module.

5. The electronic color temperature adjustment circuit as claimed in claim 4, wherein said electronic color temperature adjustment circuit further comprises a plurality of indicators D5, and said indicators D5 are respectively connected with the output ends of the corresponding said control unit U2 and are used to display the color temperatures which are currently adjusted to.

6. The electronic color temperature adjustment circuit as claimed in claim 4, wherein said adjustment and control information comprises first adjustment and control information and second adjustment and control information;

if said switch K2 is pressed down for a short time, first adjustment and control information is sent to said color temperature control module and the PWM output ends of said control unit U2 output different PWM signals to change the color temperatures of said LEDs;

if said switch K2 is pressed down for a long time, second adjustment and control information is sent to said color temperature control module, the PWM output ends of said control unit U2 are automatically switched over to output different PWM signals, and then the color temperatures of said LEDs are automatically switched over.

* * * * *